(12) United States Patent
Haviland et al.

(10) Patent No.: US 9,244,103 B1
(45) Date of Patent: Jan. 26, 2016

(54) INTERMODULATION LOCK-IN

(75) Inventors: David Brant Haviland, Bromma (SE); Erik Allan Tholén, Solna (SE); Daniel Platz, Stockholm (SE); Carsten Hutter, Skärholmen (SE)

(73) Assignee: Intermodulation Products AB (SE)

( * ) Notice: Subject to any disclaimer, the term of this patent is extended or adjusted under 35 U.S.C. 154(b) by 1183 days.

(21) Appl. No.: 13/098,597

(22) Filed: May 2, 2011

Related U.S. Application Data

(60) Provisional application No. 61/330,747, filed on May 3, 2010.

(51) Int. Cl.
*G01R 23/20* (2006.01)
*H04B 17/00* (2015.01)

(52) U.S. Cl.
CPC ............ *G01R 23/20* (2013.01); *H04B 17/0085* (2013.01)

(58) Field of Classification Search
CPC .............................. G01R 23/20; H04B 17/008
USPC .......................................................... 702/108
See application file for complete search history.

(56) References Cited

U.S. PATENT DOCUMENTS

| | | | |
|---|---|---|---|
| 4,807,146 | A | 2/1989 | Goodrich et al. |
| 2005/0250465 | A1 | 11/2005 | Gibbs |
| 2006/0235638 | A1 | 10/2006 | Verspecht |
| 2010/0312495 | A1 | 12/2010 | Haviland et al. |

OTHER PUBLICATIONS

Tholen E. A., Platz, D., Forchheimer, D., Schuler, V., Tholen, M. O., Hutter, C., and Haviland, D. B. Review of Scientific Instruments, 82, 026109 (2011).

*Primary Examiner* — Janet Suglo
(74) *Attorney, Agent, or Firm* — Schwegman Lundberg & Woessner, P.A.

(57) ABSTRACT

We describe a digital lock-in amplifier instrument which is designed to optimally extract the amplitude and phase of response at intermodulation product frequencies. This general purpose laboratory instrument has broad application in the analysis of nonlinear systems. A defining property of the intermodulation lock-in is, that the Fourier components of the drive waveform and the sampling frequency used to sample the response are all integer multiples, or close to integer multiples, of a fundamental base frequency $\Delta f$. We describe an implementation of the intermodulation lock-in with a field programmable gate array. Applications of the intermodulation lock-in are discussed, including its use in Atomic Force Microscopy.

12 Claims, 2 Drawing Sheets

INTERMODULATION LOCK-IN

CROSS-REFERENCE TO RELATED APPLICATIONS

This application claims the benefit of provisional patent application No. 61/330,747 filed 2010 May 3 by the present inventors.

BACKGROUND

Prior Art

The following is a tabulation of some prior art that presently appears relevant:

U.S. Patents

| Pat. No. | Kind Code | Issue Date | Patentee |
|---|---|---|---|
| 4,807,146 | | Feb. 21, 1989 | Goodrich et. al. |

U.S. Patents Application Publications

| Pat. No. | Kind Code | Publ. Date | Applicant |
|---|---|---|---|
| 2005/0250465 | A1 | Nov. 10, 2005 | Gibbs |
| 2006/0235638 | A1 | Oct. 19, 2006 | Verspecht |
| 2010/0312495 | A1 | Dec. 9, 2010 | Haviland et. al. |

NONPATENT LITERATURE DOCUMENTS

Tholén E. A., Platz, D., Forchheimer, D., Schuler, V., Tholén, M. O., Hutter, C., and Haviland, D. B. Review of Scientific Instruments, 82, 026109 (2011).

Intermodulation is the mixing of two or more frequencies by nonlinearity. When a weakly nonlinear system is driven with two frequencies $f_1$ and $f_2$, mixing products will occur at frequencies known as intermodulation products (IMPs):

$f_{IMP} = nf_1 + mf_2$, where n and m are integers.

When driven with more than two frequencies, the intermodulation products occur at:

$f_{IMP} = n_1 f_1 + n_2 f_2 + n_3 f_3 + \ldots$ where $n_1, n_2, n_3 \ldots$ are integers.

In many practical applications, intermodulation causes the distortion of a desired signal and it is therefore very important to accurately characterize the intermodulation distortion (IMD). For example, in radio frequency and microwave circuits intermodulation products can cause undesired out-of-band signals which disrupt communication systems. In other applications, intermodulation can be used to gain more detailed information with which one can more accurately analyze the nonlinearity of a system. For example, intermodulation measurement can be used to enhance the information content of measurements in applications where a high quality factor resonator is used as a sensor, like dynamic mode Atomic Force Microscopy (AFM).

The US patent application 2010/0312495 A1 describes how the intermodulation measurement method was used to enhance the surface analytical capabilities of the AFM. The AFM is only one of many possible applications of the intermodulation measurement technique. The intermodulation lock-in disclosed here, and described in Tholén et al. (2011), is designed as a general purpose laboratory measurement apparatus, well suited to be used in many of these possible applications.

With the traditional lock-in amplifier, a waveform consisting of one pure tone at the drive frequency is applied to a device-under-test (DUT). The response to the applied drive is analyzed and the lock-in will extract the amplitude and phase of the response at the drive frequency. By phase, we mean the phase of the response relative to the drive. The ability to extract response at the drive frequency is very useful in linear systems analysis, because linear systems respond only at the drive frequency. A digital version of the traditional lock-in amplifier has been described, U.S. Pat. No. 4,807,146 (1989).

Extensions of the lock-in amplifier have been made where the lock-in can extract the amplitude and phase at harmonics of the drive frequency, or integer multiples of one single drive frequency which is applied to the DUT. Analysis of harmonics is useful for determining the nonlinear character of the DUT, however, analysis of many harmonics requires large measurement bandwidth. Intermodulation response is often much more useful than harmonics because very high order response can be generated in a narrow frequency band, where resonance can be used to greatly enhance the response.

Further extensions of the lock-in technique have been described which use dual, or a plurality of reference signals to detect the response at a specific frequency, US patent application number 2005/0250465 A1. However, an integer-multiple relationship of these reference signals to a base frequency is not specified, nor are means described to ensure such an integer-multiple relationship. Without such an integer-multiple relationship, high Fourier leakage between reference signals will occur, making it impossible to detect weak intermodulation signals.

Lock-in amplifiers are also known as two-port network analyzers, this later name being more common in the microwave region of the spectrum. A method for probing intermodulation response in high frequency devices has been described in US patent application number 2006/0235638 A1, however, this method requires a sampling frequency converter.

DRAWINGS

Figures

FIG. 1 shows a schematic diagram of one embodiment of the intermodulation lock-in.

DETAILED DESCRIPTION

We describe herein the intermodulation lock-in. In contrast to the traditional lock-in amplifier, the intermodulation lock-in uses drive waveforms consisting of more than one frequency, or more specifically, more than one frequency component, or Fourier component. The frequency components of the drive waveform are synthesized in a very specific way in order to optimally extract the intermodulation response of the device-under-test (DUT). The intermodulation lock-in is capable of extracting the spectral response of the DUT (amplitude and phase) at the frequencies which are the intermodulation products of the frequency components of the drive waveform. The preferred implementation of this instrument uses digital signal processing, or an electronic digital circuit which does the following essential tasks:

1. Synthesis of an arbitrary waveform which is applied to a DUT. Here the DUT does not need to be a two-port electronic component or device, but could in principle be an entire "system" with an input port and an output port, such as an actuator driving a cantilever, and an optical lever sensor which reads out the deflection of the cantilever, in an Atomic Force Microscope.
2. Samples response of the DUT and computes the intermodulation response, both amplitude and phase values, or alternatively sine and cosine quadratures, at desired intermodulation frequencies.
3. All Fourier components, amplitude and phase (or sine and cosine quadratures) of the synthesized waveform in (1), and all calculated spectral components of the intermodulation response in (2), are integer multiples of a common divisor frequency, which we call the base frequency $\Delta f$, for the intermodulation measurement.
4. Both (1) and (2) above are performed with digital methods where the synthesis and sampling are synchronized. The synchronization of (1) and (2) essentially creates one master clock which prevents phase drift, and requirement (3) suppresses Fourier leakage, or interference between different components of the drive and response spectrum.

A key aspect of the intermodulation lock-in amplifier is the base frequency $\Delta f$ which allows for an unambiguous definition of the phase of all intermodulation products.

Figure 1:
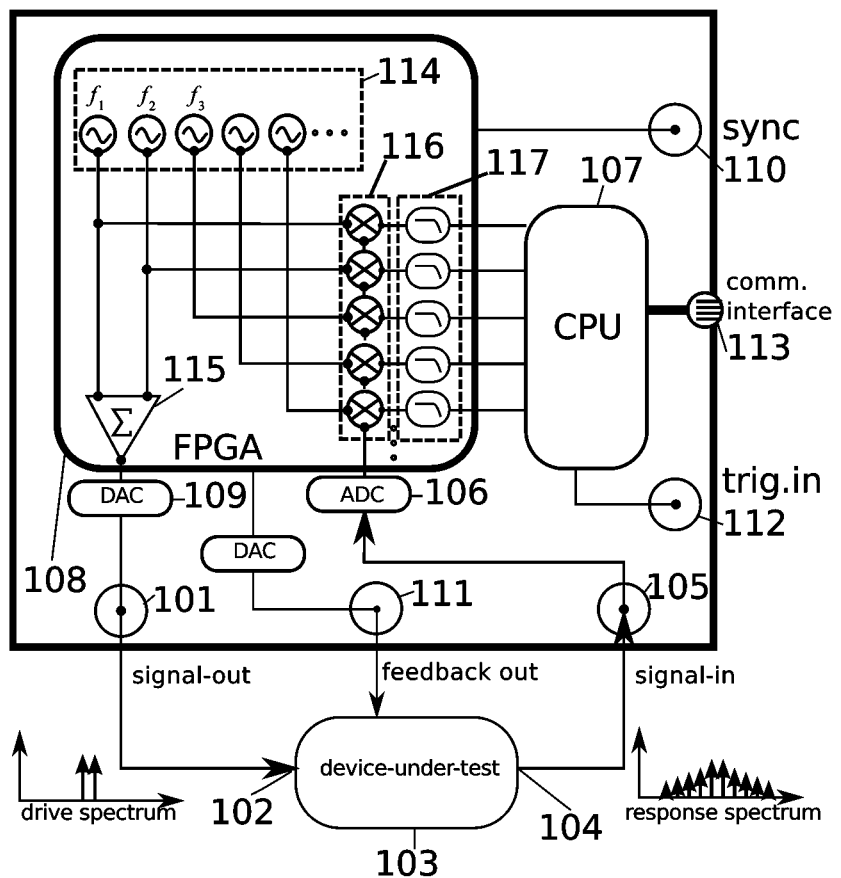

One embodiment of the intermodulation lock-in is shown in FIG. 1. The schematic of FIG. 1 is made for the purposes of explaining the intermodulation lock-in and does not represent the only embodiment of the instrument. In FIG. 1, the intermodulation lock-in generates two pure tones and delivers them to the signal-out port (101). This signal is connected to the input port (102) of a nonlinear DUT (103). The nonlinear DUT mixes the drive tones $f_1$ and $f_2$, resulting in many intermodulation products at the frequencies $nf_1+mf_2$ where n and m are integers. The response at the output port (104) of the DUT is fed to the signal-in port (105) of the intermodulation lock-in, where it is sampled by an analog-to-digital converter (106) with a sampling frequency that is also an integer multiple of the base frequency $\Delta f$. The sampling frequency is chosen so that there will occur an integer number of periods of all desired intermodulation products in the response. The condition of an integer number of periods in the sampled response means that the discrete Fourier transform of the response will be composed of discrete frequency components where the intermodulation product frequencies $f_{IMP}=nf_1+mf_2$ land exactly on frequencies of the discrete Fourier transform, so that no Fourier leakage occurs. When setting up the measurement, a computer program running on a CPU (107) is used to ensure that the drive frequencies, measurement-frequencies, and sampling frequency are all integer multiples of the base frequency $\Delta f$, and the time window for calculating the frequency domain response is one period of the base frequency.

In this embodiment, the intermodulation lock-in performs calculations (digital signal processing) on a field programmable gate array (FPGA, 108). These calculations result in the extraction of the frequency domain response at user-specified intermodulation product frequencies. Our implementation on a low-cost FPGA is capable of analyzing 32 arbitrarily chosen intermodulation frequencies, or alternatively 64 channels, where a channel refers to either a Fourier cosine or Fourier sine component of the response at an intermodulation product frequency. A simple extension of this implementation on a larger FPGA will be capable of analyzing more channels.

In another embodiment, the digital signal processing is realized by another type of circuit, for example an application specific integrated circuit, digital signal processing unit, or other integrated circuit. The purpose of this digital signal processing is to calculate Fourier cosine and Fourier sine components (or amplitude and phase) of the response at the measurement-frequencies, with no delay needed to calculate the entire discrete Fourier Transform. This real-time multiple signal analysis is very useful in applications such as scanning dynamic atomic force microscopy, where the nonlinear response is changing rapidly as the AFM probe (an oscillating cantilever with a sharp tip) is scanned over a surface.

In another embodiment of the intermodulation lock-in, a drive consisting of more than two frequency components is used to drive the nonlinear DUT. If all Fourier components of the drive are at frequencies which are integer multiples of $\Delta f$, then the response will only be at intermodulation products, which are also integer multiples of $\Delta f$. Sampling the response with a sampling frequency which is an integer multiple of $\Delta f$ will result in a discrete Fourier transform of the response which is composed of discrete frequency components that are exactly at the intermodulation product frequencies.

In another embodiment, a master clock is used to synchronize the digital-to-analog converter (109), the analog-to-digital converter (106), and the digital signal processing unit (108).

In another embodiment, an external port (110) is used as a means to synchronize the master clock to an external signal.

In another embodiment, an output port (111) sends a signal that is determined by a mathematical function of the frequency domain response. This output port is very useful, for example, for controlling the DUT. In particular, for dynamic mode AFM, this port can be used to control the height of the probe as it scans over a surface.

In another embodiment, an input port (112) receives a signal which is used to trigger the start of a measurement. In one embodiment, said start of a measurement is given by the start of the time window for calculating the frequency domain response.

In another embodiment, a communication interface (113) provides immediate and continuous access to configuration parameters of the intermodulation lock-in, the calculated frequency domain response, or any mathematical function thereof. It is particularly useful if this interface can access the frequency domain response while the intermodulation lock-in is continuously processing the response signal of the DUT, without interruption of the measurement.

In another embodiment, a variable gain amplifier or an attenuator can be inserted between the signal-out port (101) and the input port (104) of the DUT, in order to easily change the level of the signal applied to the DUT.

In another embodiment, a variable gain amplifier or attenuator can be inserted between the output port (104) of the DUT and the signal-in port (105) of the intermodulation lock-in, in order to easily change the signal level of the response signal.

In another embodiment, the Fourier components of the drive are not exact integer multiples of the base frequency $\Delta f$, but close to integer multiples. In this case, a small amount of Fourier leakage will occur in the calculated intermodulation spectrum. If this small amount of Fourier leakage is below a certain tolerance level, determined by the application, then the Fourier leakage will result in no or very little loss of information. Thus, when the drive waveform components and sampling frequency are close-to integer multiples of $\Delta f$, a useful intermodulation measurement can be made with the intermodulation lock-in. In this embodiment, a computer program running on a CPU (107) is used to ensure that the drive frequencies, measurement-frequencies and sampling frequency are close enough to the base frequency Δf, such that the Fourier leakage at the measurement-frequencies is limited to a selected threshold value.

In another embodiment, the drive waveform at the signal-out (101) port is efficiently calculated using look-up tables with pre-calculated values, and pointers which step through the table and output the pointed-to value at a particular time step. This type of digital signal synthesis can be done for example in the FPGA. The traditional look-up table method has a pointer that steps through one buffer (look-up table) of stored values (repeatedly stepping through the buffer in a circular fashion) and outputs the pre-calculated values to signal-out. Intermodulation waveform synthesis often uses closely spaced frequency components in the drive spectrum, separated by a small frequency, for example a small base frequency Δf (or some integer fraction or integer multiple of Δf). The resulting arbitrary drive waveform therefore has a period which is very long in time, T=1/Δf. To generate accurate arbitrary waveforms with long period time by the traditional look-up table method requires a very long table, and therefore much memory. We invented a method where long arbitrary waveforms can be generated by using two (or more) short tables and two (or more) pointers. The short tables can be significantly shorter than the number of samples which comprise one period of the resulting drive waveform. The pointers step through the tables with different speeds, and the waveform is calculated as the sum of the values from the two (or more) tables. The period of the resulting drive waveform is then realized when the two (or more) pointers, each moving at a different stepping speed, have cycled through their short buffers many times, so that they are all simultaneously at the starting position of their respective short buffers. This use of two (or more) buffers (look-up tables) with pointers traversing the tables at different speeds can accurately synthesize arbitrary waveforms with far less memory than a single table method. This multiple short-table method is ideally suited to the type of waveforms needed for the signal-out port of the intermodulation lock-in. One implementation of this method is shown in FIG. 1 using look-up tables (114) a summation device (115) and a digital-to-analog converter (109).

In another embodiment, the above multiple short-table method is further enhanced by using interpolation to calculate values "between" the entries in the short buffers such that pointers need not move at integer steps through the look-up table.

In yet another embodiment, the above multiple short-table method is used to synthesize the signals needed to calculate the frequency domain response. Pointer step through look-up tables (114) with different speeds. The response from a device-under-test is digitized using an analog-to-digital converter (106). Each value pointed-to value is multiplied with a multiplication circuit (116) to the digitized response signal. Each of the resulting products are then integrated for a selected time period using accumulators (117).

Advantages

The intermodulation lock-in has the great advantage that the operator can directly and easily measure the nonlinear response of the DUT at many frequencies, simultaneously and in real time, with a tolerable amount of Fourier leakage between the many measurement frequencies. This is only possible if all relevant frequencies are chosen to be close to integer multiples of a base frequency. The apparatus is designed to ensure that this condition is fulfilled.

The intermodulation lock-in is extremely useful in that it allows one to essentially compress the response of a nonlinear system, in real-time. Rather than storing all samples of the response, only those intermodulation products of interest, for example those with good signal-to-noise ratio, can be extracted in real-time and stored for later analysis. Weakly nonlinear systems (i.e. systems which do not exhibit period doubling or chaos) will have response only at intermodulation frequencies. If the multi-tone drive signal is synthesized as described above, then the intermodulation product frequencies are known, and it is therefore possible to lock-in on these frequencies and extract the amplitude and phase of the response at these intermodulation product frequencies. The lock-in aspect is possible because we have a mathematical relationship which tells us exactly where the intermodulation response will occur in relation to the base frequency Δf.

In our first implementation, we designed the intermodulation lock-in so that it can also be run in a mode where the FPGA does the waveform synthesis and sampling of the response, but not the Fourier calculations to get the spectrum. In this mode, all sampled data is streamed to a computer where a Fast Fourier Transform (FFT) of the response is calculated. The resulting FFT will contain the entire intermodulation response. The intermodulation lock-in run in this streaming mode is only doing a proper synthesis and sampling with the essential conditions given above, so the intermodulation response can be extracted without phase drift or Fourier leakage.

Figure 2:
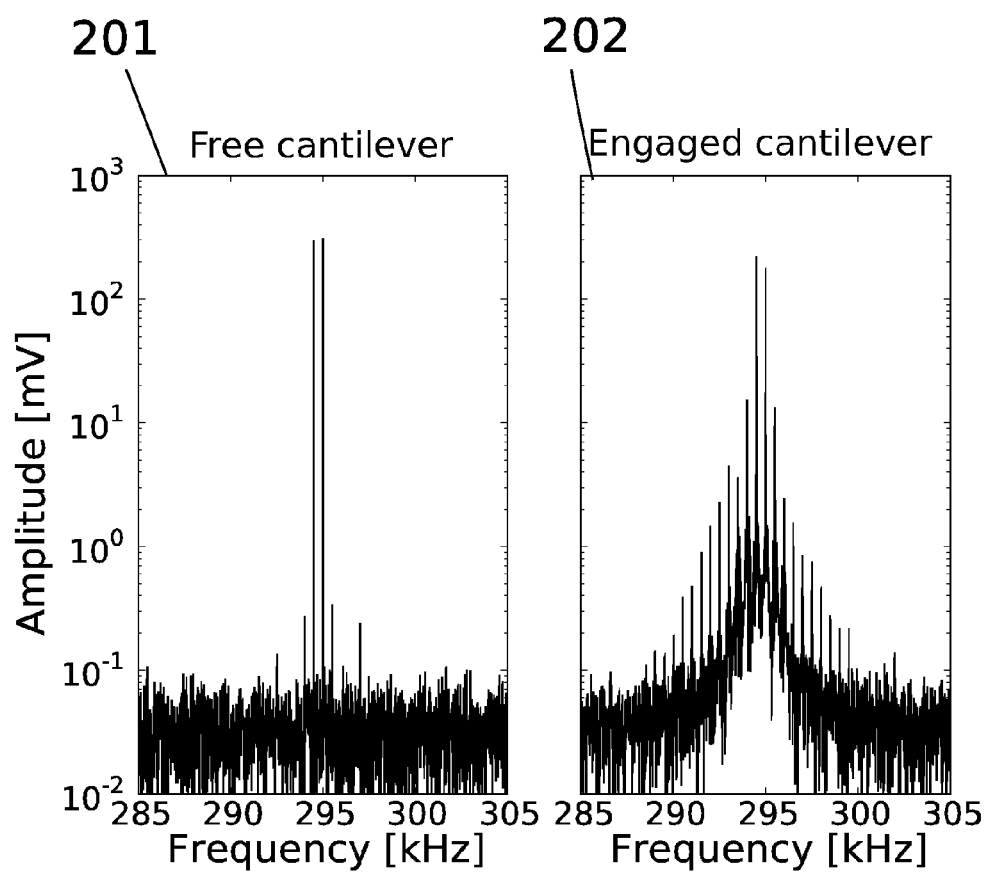
FIG. 2 shows the response spectrum of a free AFM cantilever (left panel) to two drive frequencies. The cantilever engaged with the surface (right panel) shows strong intermodulation due to the nonlinear tip-surface interaction.

An example of an intermodulation spectrum measured as described above is given in FIG. 2. The particular DUT in this case was an oscillating cantilever in an Atomic Force Microscope (AFM). When the waveform synthesis and sampling are made as described above, the resulting response spectrum appears as in FIG. 2. The left panel (201) shows a free AFM cantilever above a surface drive with two drive frequencies separated by Δf. The free cantilever shows only very weak response above the noise at a few intermodulation product frequencies. When the cantilever engages a surface, the DUT becomes much more nonlinear and the response (202) shows many new peaks at intermodulation frequencies, $f_{IMP}=nf_1+mf_2$, where n and m are integers.

We claim:

1. An apparatus to analyze nonlinear properties of a device-under-test, the apparatus comprising:
a signal generator operable to send a drive signal being the sum of a plurality of pure tones to at least one input port of the device-under-test, the plurality of pure tones being integer multiples of a base frequency;
an analog-to-digital converter coupled to the at least one output port of the device-under-test and operable to convert to a digital response signal, a sampling frequency of the analog-to-digital converter being an integer multiple of the base frequency; and
a digital processing unit operable to receive the digital response signal from the analog-to-digital converter, the digital processing unit being further operable to calculate a frequency domain response at a plurality of measurement-frequencies, the plurality of measurement-frequencies being integer multiples of the base frequency, a time window to calculate the frequency domain response being an integer multiple of a period corresponding to the base frequency.

2. The apparatus of claim 1, wherein the device-under-test has at least one resonance and the plurality of pure tones has frequencies such that the response signal is enhanced by the resonance.

3. The apparatus of claim 1, wherein the frequency domain response is an amplitude and phase at the measurement-frequencies.

4. The apparatus of claim 1, wherein the frequency domain response is comprised of sine and cosine components at the measurement-frequencies.

5. The apparatus of claim 1, further comprising a variable gain amplifier coupled between the signal generator and the input port of the device-under-test.

6. The apparatus of claim 1, further comprising a master clock to synchronize the signal generator, the analog-to-digital converter, and the digital processing unit.

7. The apparatus of claim 6, wherein the apparatus is operable to synchronize the master clock to an external signal.

8. The apparatus of claim 1, wherein the measurement-frequencies are intermodulation frequencies of the drive signal.

9. The apparatus of claim 1, further comprising at least one output port to send a signal determined by a mathematical function of the frequency domain response.

10. The apparatus of claim 1, further comprising at least one input port to externally control the time at which the time window begins.

11. The apparatus of claim 1, further comprising a communication interface to provide immediate and continuous access to configuration parameters of the apparatus, the frequency domain response, and mathematical functions of the frequency domain response, concurrent with the apparatus being configured to process the digital response signal continuously.

12. The apparatus of claim 1, further comprising a variable gain amplifier placed between the at least one output port of the device-under-test and the analog-to-digital converter.

* * * * *